United States Patent
Li

(12) 
(10) Patent No.: US 6,577,044 B1
(45) Date of Patent: Jun. 10, 2003

(54) MULTI-OUTPUT COMPOSITE PIEZOELECTRIC TRANSFORMER WITH EXPANSION VIBRATION MODE

(75) Inventor: Hongyi Li, Beijing (CN)

(73) Assignee: Beijing Hanzhiyuan Electron Co., Ltd., Beijing (CN)

( * ) Notice: Subject to any disclaimer, the term of this patent is extended or adjusted under 35 U.S.C. 154(b) by 0 days.

(21) Appl. No.: 09/980,206

(22) PCT Filed: May 26, 2000

(86) PCT No.: PCT/CN00/00131
§ 371 (c)(1),
(2), (4) Date: Nov. 30, 2001

(87) PCT Pub. No.: WO00/74152
PCT Pub. Date: Dec. 7, 2000

(30) Foreign Application Priority Data

Jun. 1, 1999  (CN) .......................... 99107845 A

(51) Int. Cl.⁷ ............................................ H01L 41/047
(52) U.S. Cl. ...................................................... 310/366
(58) Field of Search ................................. 310/359, 366

(56) References Cited

U.S. PATENT DOCUMENTS 5,241,236 A  * 8/1993  Sasaki et al. ............... 310/328
5,438,232 A  * 8/1995  Inoue et al. ................. 310/328
6,366,006 B1  * 4/2002  Boyd ........................... 310/359

FOREIGN PATENT DOCUMENTS

| JP | 11-330575 | * 11/1999 | ........... H01L/41/08 |
| JP | 2000-150978 | * 5/2000 | ......... H01L/41/107 |
| JP | 2000-315828 | * 9/2000 | ......... H01L/41/107 |

* cited by examiner

*Primary Examiner*—Thomas M. Dougherty
(74) *Attorney, Agent, or Firm*—Burns, Doane, Swecker & Mathis, L.L.P.

(57) ABSTRACT

The present invention discloses a multi-output composite piezoelectric ceramics transformer with expansion vibration mode, its many features are as follows: the primary and the secondary piezoelectric ceramics assemblies with multi-output and insulation construction are laminated and bonded by polymer adhesives to form a lamination construction; the electrodes of the piezoelectric assemblies are lead out by leading-out construction to form input and output terminals, the entire insulation layers are formed by isolation layers and insulation material covered on the exterior surfaces of the piezoelectric ceramics assemblies and the electrodes leading-out construction. The strengths of the transformer include easy adjustment of parameters for the purpose of matching the primary and the secondary, high output power and high conversion efficiency.

6 Claims, 5 Drawing Sheets

MULTI-OUTPUT COMPOSITE PIEZOELECTRIC TRANSFORMER WITH EXPANSION VIBRATION MODE

BACKGROUND OF THE INVENTION

The present invention relates to a piezoelectric ceramics transformer, and particularly to a multi-output composite piezoelectric ceramics transformer with expansion vibration mode.

The piezoelectric ceramics transformer of the prior art mainly consists of single layered or multi-layered piezoelectric ceramics fabricated by only one sintering process. Various parameters of the primary and the secondary of a piezoelectric ceramics assembly of the transformer should be adjusted to meet the matching requirements of the different parameters of the inputs and the outputs, especially for a step down piezoelectric ceramics transformer. Therefore, different types of piezoelectric materials and complicated constructions should be employed in designing the primary and secondary assemblies of the piezoelectric transformer. However, different types of piezoelectric materials require different sintering conditions. It is extremely difficult to fabricate an ideal piezoelectric ceramics transformer in only one sintering process.

In the past, a step down piezoelectric ceramics transformer is driven by vibration in its thickness direction so that piezoelectric property of d33 of the piezoelectric materials can be used and highly operating frequency can be obtained simultaneously. However, the stress distribution induced by the vibration in the thickness direction results in the technical difficulties in arranging the primary and the secondary assemblies of the piezoelectric ceramics transformer. Moreover, the stress distribution also gives rise to a charge cancellation and none-equilibrium charge distribution, which, in turn, inversely affects the performance of the piezoelectric transformer; hence, satisfactory outputs cannot be obtained.

On the other hand, though there is an isolation layer between the primary and the secondary assemblies of the piezoelectric ceramics transformer, the isolated capacitance caused by the isolation layer is too large so that only AC channels can be formed, of which the function of isolation layer is only to isolate DC, and appropriate isolation cannot be achieved when the piezoelectric ceramics transformer operates at a high frequency. Some isolation layers may reduce the capacitance between the primary and the secondary assemblies, but it causes the difficulty in stress transport, an increase of power consumption and a decrease of power output etc. Because the size of the piezoelectric ceramics transformer is rather small and the thickness is only a few millimeters, even insulation property of the inner isolation layer is extremely high, the isolation may be invalidated for being breakdown due to the narrow spacing between the primary and the secondary assemblies, as well as the surface charge diffusion. Consequently, damage of the instrument and personal injuries may occur.

The piezoelectric ceramics transformer of the prior art, working in single output mode, fails to meet the multi-output requirements of many electronics equipment, which considerably limits the application of the piezoelectric ceramics transformer.

SUMMARY OF THE INVENTION

The object of the present invention is to provide a multi-output piezoelectric ceramics transformer with expansion vibration mode that solves the above problems, and has the character of easy adjustment for the purpose of matching various parameters of the primary and the secondary assemblies, high output power and high conversion efficiency, reliable isolation between the primary and the secondary assemblies, and satisfactory performance to meet the requirements of the applications of step down power supply.

To achieve the above object, the present invention provides a multi-output composite piezoelectric ceramics transformer, which is driven in expansion vibration mode and has the primary and the secondary piezoelectric ceramics assemblies; characters in that a multi-output composite piezoelectric ceramics transformer with expansion vibration mode comprises a high polymer bonding structure, an insulating isolative structure and an electrodes lead structure, the primary and the secondary piezoelectric ceramics assemblies as well as the isolation layers of a insulating isolative structure are laminated one by one and bonded firmly with polymer adhesives to form a sandwiched structure. The electrodes are leaded out by electrodes lead structure of the piezoelectric ceramics assemblies to form the external input and output terminals. The exterior surfaces of both the piezoelectric ceramics assemblies and electrode lead structure are coated with film of polymer insulating materials which together with isolation layers, form a continuous and integrated insulating isolation structure of the transformer.

The piezoelectric ceramic transformer comprises multiple outputs. The secondary piezoelectric ceramic subassemblies are isolated from each other by an isolation plate in the independent multi-output subassemblies. The adjacent piezoelectric ceramic plates are polarized in opposite directions to each other in a secondary subassembly. Two adjacent piezoelectric ceramic plates, which are at the interface between the positive and the negative output subassemblies, respectively, and which share a common grounding electrode, are arranged in accordance with the same polarization directions. The adjacent piezoelectric ceramic plates in each one of the secondary subassemblies are polarized in opposite directions to each other. All lead side electrodes of surface electrodes which are in a positive output piezoelectric ceramic subassembly and the polarization directions thereof are the same as that of a electrode which is in a negative output piezoelectric ceramic subassembly and adjacent to the positive output piezoelectric ceramic subassembly, and connected by the lead electrode structure. These electrodes are connected with the lead side electrodes of surface electrodes which are in the negative output piezoelectric ceramic subassembly and the polarization directions thereof are the same as that of a electrode which is in a positive output piezoelectric ceramic subassembly and adjacent to the negative output piezoelectric ceramic subassembly. The connected electrodes form a common grounding electrode. All other side electrodes of the positive or the negative output subassemblies are lead out by a lead electrode structure, to form the other electrodes of the positive or the negative outputs, respectively.

The sandwiched structure is formed between the primary and the secondary assemblies of the transformer constituted with the polymer composite structure and the multi-output composite piezoelectric ceramics with expansion vibration mode of this invention, and the primary piezoelectric ceramics assembly can be divided into two identical assemblies, each of which is located on the top and bottom sides of the transformer respectively, and a secondary piezoelectric ceramics assembly is located in the middle of the transformer between two primary assemblies. The upper and lower surfaces of the secondary piezoelectric ceramics assembly are joined to the lower and upper surfaces of the two primary piezoelectric assemblies by the isolation layers, respectively, furthermore all piezoelectric ceramics assemblies and the isolation layers are tightly bonded with the polymer bonding structure to form a sandwiched structure. Alternatively, the structure of the transformer of this invention can also be formed by inserting the primary piezoelectric assembly in the middle of the transformer while the two secondary piezoelectric ceramics assemblies are positioned on both sides of the primary piezoelectric ceramics assembly. The sandwiched structure thereof effectively eliminates the distortion vibration possibly caused by the difference between the damping states of the primary and the secondary piezoelectric ceramics assemblies, and ensures that the transformer vibrates in a single expansion vibration mode.

The insulating isolative structure of this invention comprises the isolation layer and the insulating films. The isolation layer is positioned between the primary and the secondary assemblies, and if required, the isolation layers can also be inserted between different secondary subassemblies in the multi-output piezoelectric ceramics transformer. The isolation layer that is a plate made of a ceramic, a glass or a film of composite materials with a diameter slightly bigger than that of the piezoelectric ceramics assembly, play the part of isolation inside the piezoelectric ceramics transformer. The modulus of elasticity of the isolation layers should be in the range of one tenth to ten times of that of the piezoelectric ceramics material thereof, so that the vibrating status of the transformer cannot be inversely affected by the isolation layers. Insulating film covers the exterior surfaces of both the primary and the secondary assemblies as well as the exposed exterior surfaces of lead electrode structure and bonds with the isolation layers, therefore, combined with the isolation layers, the insulating film wraps and bonds the entire piezoelectric ceramics assemblies and forms a compact insulating isolative structure, which effectively protects the piezoelectric ceramics transformer from insulation failures caused by various factors, such as the internal voltage breakdown, the external voltage breakdown resulting from the air, or the surface electric leakage.

The insulating materials which are appliededin the transformer by the processing of spraying or painting are made of a variety of polymer materials, such as epoxy resin, phenolic aldehyde resin, urea-formaldehyde resin, polyamino resin, polyester resin, and polyimide resin.

When the techniques of the present invention are adopted, the composite structure and the multi-output of the transformer make it possible to improve performance of the transformer in many aspects, such as, easy matching of the parameters of both the primary and the secondary assemblies, high output power, high conversion efficiency, reliable isolation of the individual piezoelectric ceramics assembly, and ability to meet the requirements of the step down power supply in the practical applications.

BRIEF DESCRIPTION OF THE DRAWINGS

Prefer embodiment according to the present invention will be described detail with reference to the accompanying drawings.

DETAILED DESCRIPTION OF THE INVENTION

Figure 1:
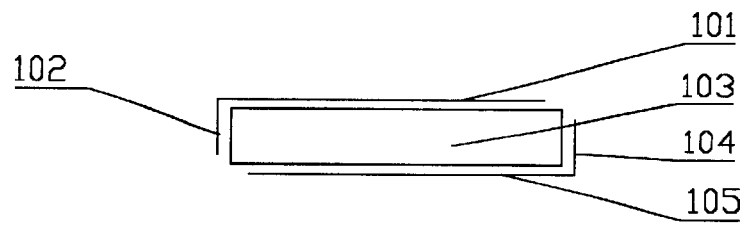
FIG. 1 is the schematic diagram of the structure of a piezoelectric ceramics plate according to the present invention.
Figure 2:
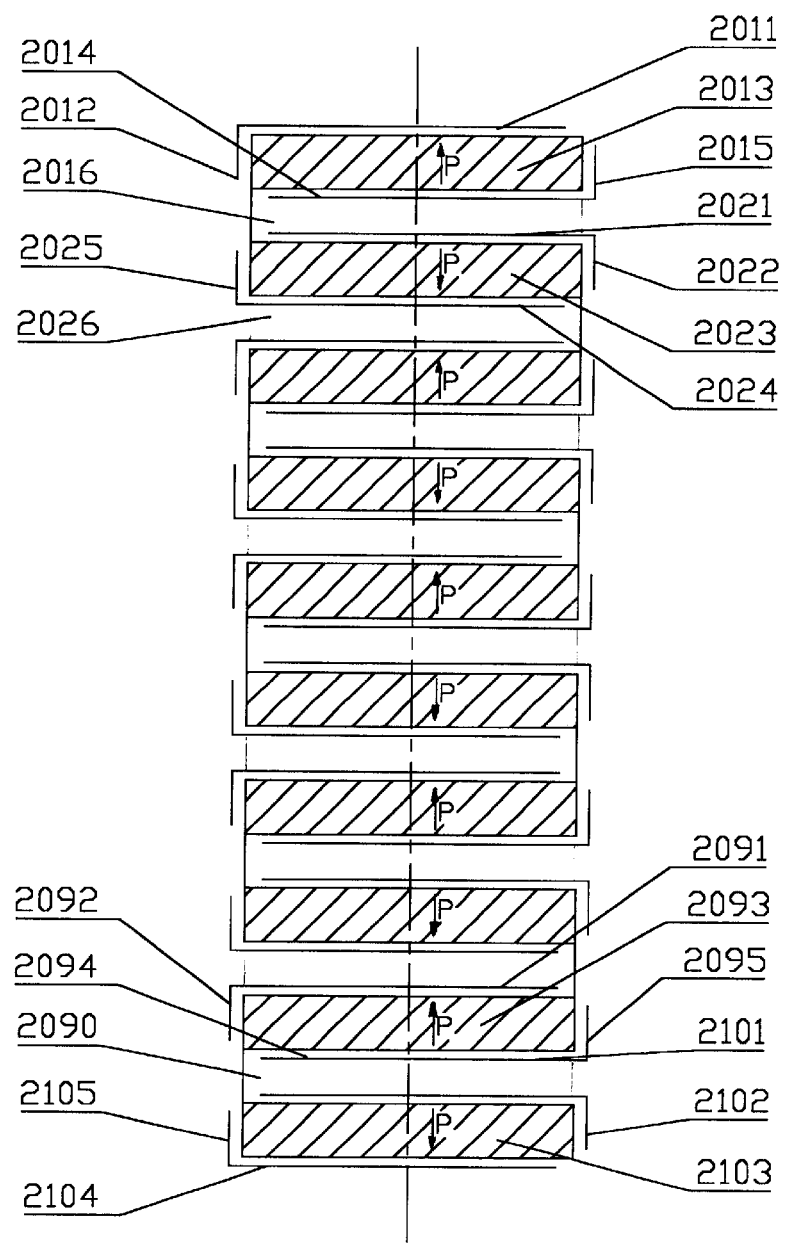
FIG. 2 is the schematic diagram of the structure of the output piezoelectric ceramics assembly according to the present invention.

As shown in FIG. 1, the piezoelectric ceramics assembly of this invention consists of a series of thin, circular-shaped plates 103 with the same diameter, and metal electrodes 101 and 105, which are formed on the upper and lower surfaces of the plate, furthermore, two lead side electrodes 102 and 104, which are connected to the upper and lower surface electrodes respectively, are made on the side surfaces of the plate, respectively, to form a portion of lead electrode structure. The piezoelectric ceramics circular-shaped thin plate is polarized in the direction of its thickness. The primary piezoelectric ceramics assembly comprises either one or several piezoelectric ceramics circular-shaped plates with the same thickness, that are laminated in such a way that the adjacent plates are polarized in opposite directions to each other, and the adjacent electrodes of the two plates are connected to form the primary assembly. The number and thickness of the piezoelectric ceramics circular-shaped plate are determined on the basis of the requirements of the input impedance matching, the input voltage and the input power matching. The secondary piezoelectric ceramics assembly is divided into corresponding secondary subassemblies on the basis of the number of the output terminals; the thickness and the material of the piezoelectric ceramics plates in any one of the secondary subassemblies should be the same, but the thickness and the material of the piezoelectric ceramics plates in different secondary subassemblies can be different, furthermore the number, thickness of the plate and the type of material of the piezoelectric ceramics in any one of the same subassembly are determined by the requirements of the output voltage, the output power and the output impedance matching. In the cases of both the single output mode and the independent multi-output mode, the individual piezoelectric ceramics plates in the secondary subassemblies are laminated in such a way that the adjacent plates are polarized in opposite directions to each other, and the adjacent electrodes of the two plates are connected, as shown in FIG. 2.

Figure 3:
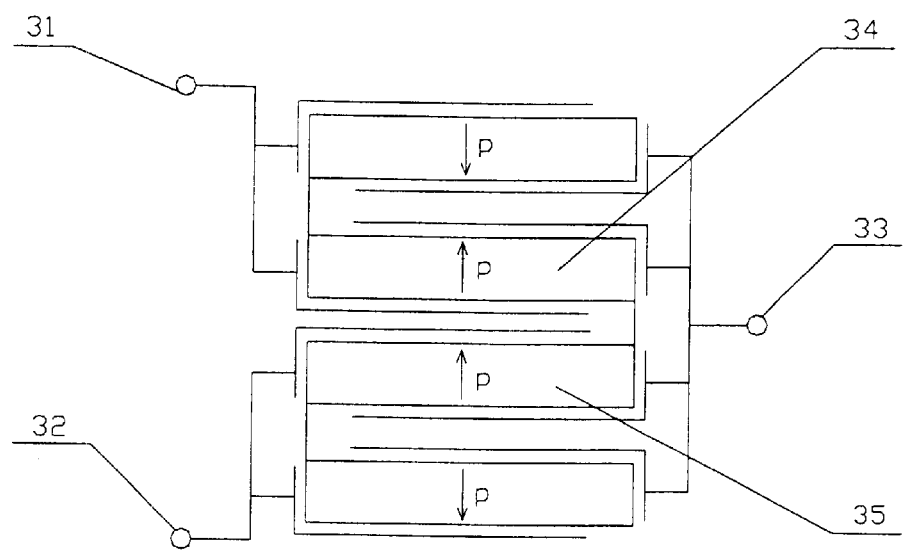
FIG. 3 is the schematic diagram of the arrangement of the piezoelectric ceramics circular-shaped plate of the secondary piezoelectric ceramics assembly, in which its positive and negative outputs share a common grounding electrode according to the present invention.

The arrangement of the piezoelectric ceramics circular-shaped plates in the positive and the negative outputs sub-assemblies, in which the positive and the negative outputs share the common grounding electrode in the secondary subassemblies, shown in FIG. 3, resembles the arrangement of the secondary assembly used in the single output mode. The two adjacent piezoelectric ceramics plates 34 and 35, which are at the interface between the positive and negative output subassemblies and belong to the positive or the negative outputs subassemblies respectively, are arranged in accordance with the same polarization directions, and the polarization direction of the lead side electrodes at the interface between plate 34 and 35 are also the same. The side electrode assemblies which belong to the positive or the negative output subassemblies of the secondary subassembly, respectively, and polarized in the same direction as that of the adjacent piezoelectric ceramics plates 34 and 35, respectively, are connected by the terminal plates and used as the common grounding electrode 33 of the dual-output subassemblies, furthermore, the other side electrodes assemblies of the positive or the negative subassemblies, which polarized in the opposite direction as that of the adjacent piezoelectric ceramics plates 34 and 35 respectively, are used as the output electrodes 31 and 32 of the positive and the negative, respectively. There are isolation layers between individual secondary subassemblies to isolate from each other.

Figure 4:
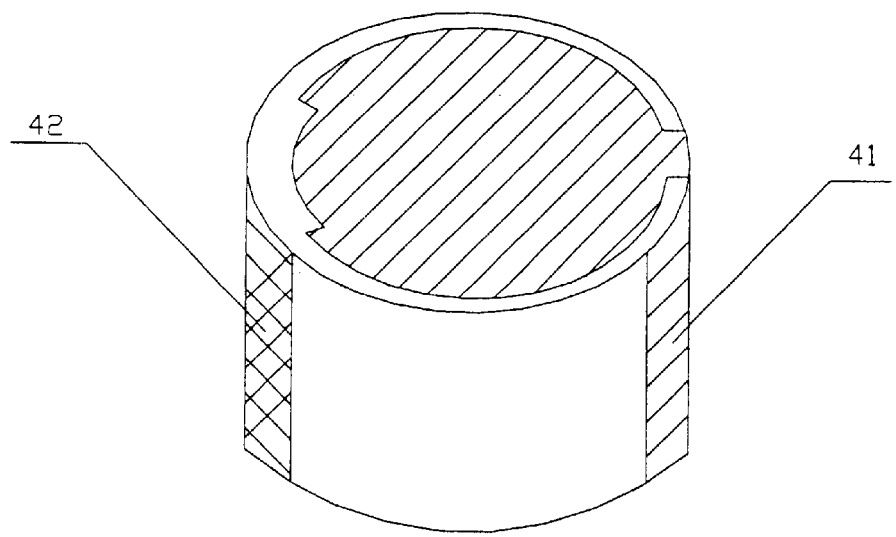
FIG. 4 is the schematic diagram of the lead side electrodes of the output piezoelectric ceramics assembly according to the present invention.

The electrode lead structure of the present invention comprises two parts, as shown in FIG. 4. One part of the electrode lead structure comprises the lead side electrodes assemblies 41 and 42, which are located on the two side surfaces of piezoelectric ceramics circular-shaped plates and electrically connected to the upper and lower surface electrodes of the plates, respectively. The side electrodes of the piezoelectric ceramics circular-shaped plates are arranged in the same orientation for each one in the same subassembly to make the electrical connection easy. The other part of the electrode lead structure is a terminal plate, which is used to connect the input and output terminals, in which one end of a terminal plate is connected to the lead side electrodes of the corresponding piezoelectric ceramics subassembly or assembly by soldering to connect the lead side electrodes arranged in the same side in one subassembly or assembly, and the other end is a connector for the input or the output.

The terminal plate is made of copper or steel. It has the same shape as that of the side electrode or side electrode assemblies which are required to be connected. The area of the terminal plate is the same or slightly smaller than that of the side electrode.

The polymeric composite structure of the present invention are bonding layers among the individual circular-shaped plates in the primary and the secondary piezoelectric ceramics assembly, as well as the isolation layers of the insulating isolation layers, comprising polymers such as epoxy resin, phenolic aldehyde resin, urea-formaldehyde resin, polyether, polyimide resin and other anti-high temperature heterocyclic polymers. The polymereric composite structure is applied by the processing of surface coating, lamination, and solidification or alternatively by injection.

The above and other objects, features and advantages of the present invention will be more apparent in the following description, however, which should not be taken as limitations of the present invention, but as an explanation and demonstration only.

EXAMPLE 1

A piezoelectric ceramics transformer of this invention has been formed, which operates at voltages ranging from 170 V to 250 V, generates an output voltage of 12 V, and the matching impedance is preferred 8 ohm. The secondary piezoelectric ceramics assembly of the transformer is made of P5 piezoelectric ceramics material, comprising 10 layers, and each piezoelectric ceramics layer is a circular-shaped thin plate 103 with a thickness of 0.3 mm and a diameter of 26 mm, as shown in FIG. 1. The silver electrodes 101 and 105 are made on the upper and lower surfaces of a piezoelectric ceramics plate, respectively, and two lead side electrodes 102 and 104, which are connected to the upper and lower surfaces silver electrodes respectively, are prepared on the two side surfaces of a piezoelectric ceramics circular-shaped thin plate respectively; wherein the separation between the upper or lower surface electrodes and the lead side electrode on the same plate is large than 0.3 mm so as to ensure good electric isolation between the two electrodes with opposite polarization directions. As shown in FIG. 2, 10 layers of piezoelectric ceramics plates are stacked one by one, and the two adjacent plates are polarized in opposite directions. The lead side electrodes 2012, 2025, 2092, and 2105 of the surface electrodes polarized in the "positive" direction are arranged at the same orientation to form the positive lead side electrodes assembly 42 of the secondary piezoelectric ceramics assembly (as show in FIG. 4). Similarly, the lead side electrodes 2015, 2022, 2095 and 2102 of the surface electrodes polarized in the "negative" direction are arranged also at the same orientation to compose the negative lead side electrodes assembly of the secondary piezoelectric ceramics assembly so that the electrodes are easily leaded out. The polarization directions of the adjacent surface electrodes (2014, 2021; ... , 2094, 2101) are identical. The 10 plates in the stack are adhered to forms a whole laminated construction by the epoxy adhesive layers 2016, 2026, ... 2090 etc.

Figure 5:
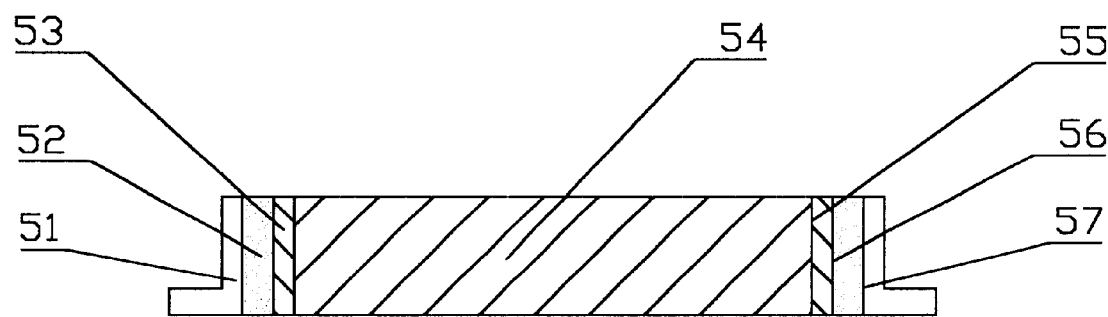
FIG. 5 is the schematic diagram of the lead electrodes structure of the secondary piezoelectric ceramics assembly according to the present invention.

FIG. 5 shows a schematic diagram of the lead electrodes structure of the secondary piezoelectric ceramics assembly. Lead soldering sheets 51 and 57 are connected to the two lead side electrodes assembly 53 and 55 of the secondary piezoelectric ceramics assembly 54, respectively, by soldering with the braze 52 and 56 so that each one of the lead side electrodes of the side electrodes assembly are electrically well connected with the other lead side electrodes of the same lead side electrodes assembly. The external output terminals of the piezoelectric transformer are formed by means of lead soldering sheets.

The primary piezoelectric ceramics assembly comprises two piezoelectric ceramics circular-shaped plates, made of P8 piezoelectric ceramics material, with a thickness of 1.6 mm and a diameter of 26 mm. The silver electrodes are made on the upper and lower surfaces of the piezoelectric ceramics plate, respectively, and the lead electrodes, which are connected to the upper and lower surface silver electrodes, respectively, are fabricated on the two side surfaces of piezoelectric ceramics circular-shaped plates. The schematic diagram of the construction of the primary piezoelectric ceramics assembly resembles that shows in FIG. 1.

The isolation plate of the insulating isolative structure is made of glass having a thickness of 0.3 mm and a diameter of 27 mm.

Figure 6:
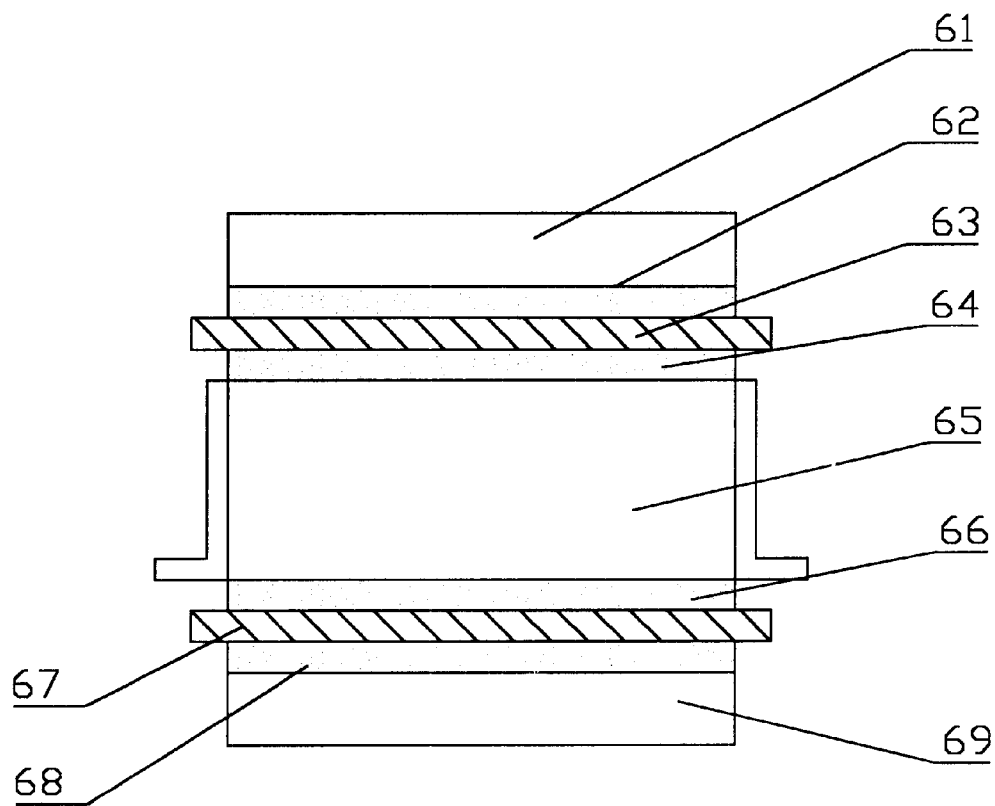
FIG. 6 is the schematic diagram of the main body structure of the transformer composed of the input and output piezoelectric ceramics assemblies and the isolation layers according to the present invention.

FIG. 6 illustrates the main body construction of a piezoelectric ceramics transformer composed of the input (primary) and output (secondary) piezoelectric ceramics assemblies as well as the isolation plates. The primary piezoelectric ceramics assemblies 61 and 69 are positioned at the top and bottom surface of the transformer, respectively, and the secondary piezoelectric ceramics assembly is inserted between the two primary piezoelectric ceramics assemblies, in which the primary and the secondary piezoelectric ceramics assemblies are isolated by the isolation plate 63 and 67. Each of the parts described above is bonded firmly by means of epoxy adhesive layers 62, 64, 66 and 68.

Figure 7:
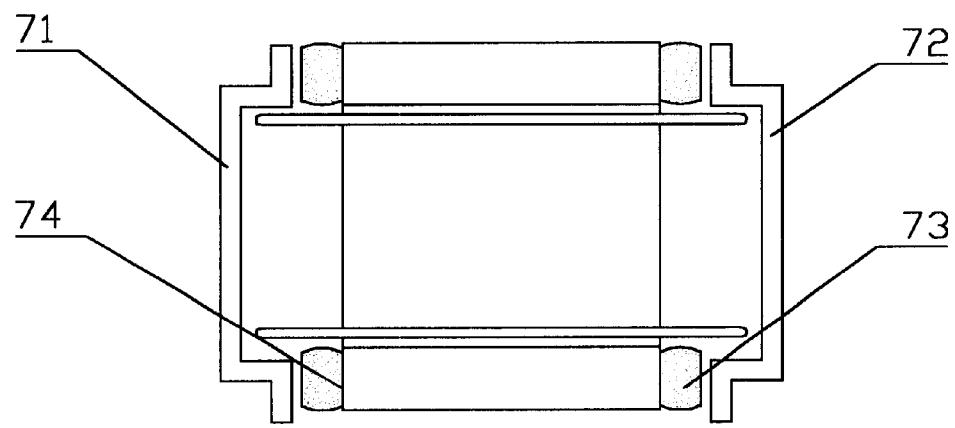
FIG. 7 is the schematic diagram of the lead electrodes structure of the primary electrodes according to the present invention.

FIG. 7 is the schematic diagram of the lead structure of the primary electrodes. The two ends of the terminal plates 71 or 72 are connected to the side electrodes assembly 74 of the primary piezoelectric ceramics assembly by soldering with solder 73, respectively, so the homopolar electrodes of the primary piezoelectric ceramics assembly are connected by the terminal plate which constitutes the external input terminal.

Figure 8:
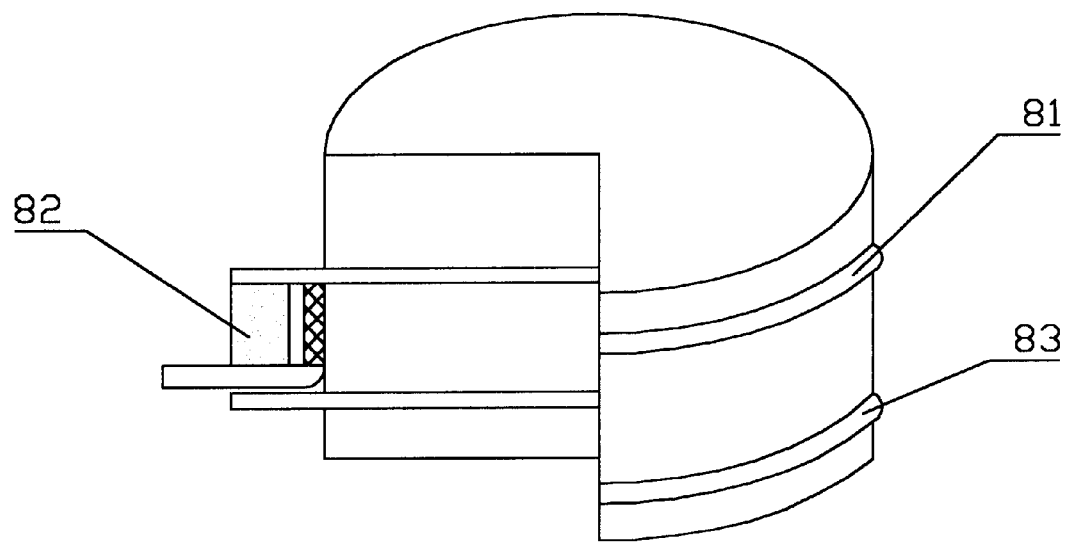
FIG. 8 is the schematic diagram of the insulating isolative structure according to the present invention.

FIG. 8 is the schematic diagram of the insulating isolative structure of this invention.

The exposed surfaces of the secondary piezoelectric assemblies between the two isolation plates 81 and 83, and the exposed surfaces of the lead electrodes structure as well as the output wires of the secondary assemblies are entirely coated with layers 82 of epoxy sealed adhesive with a thickness of 0.3 mm to form a complete protection coverage among 82, 81 and 83 so that a complete insulation among all parts of the secondary assemblies and from the environment can be achieved. Thus, a reliable isolation of the primary and the secondary assemblies of the piezoelectric ceramics transformer are realized.

The technical parameters of the transformer of this embodiment are as follows:

| | |
|---|---|
| Operating frequency: | 90 kHz |
| Maximum output power: | 45 W |
| Output voltage: | 12 V |
| Maximum conversion efficiency: | 98% |

Insulating property between the primary and the secondary assemblies:

5000 V D.C. leakage current<80 µA

EXAMPLE 2

A three-output composite piezoelectric ceramics transformer with expansion vibration mode operating at the input of 110 V, 50 Hz, has been developed to simultaneously generate power of three different output voltages of +15 V and ±5 V.

Figure 9:
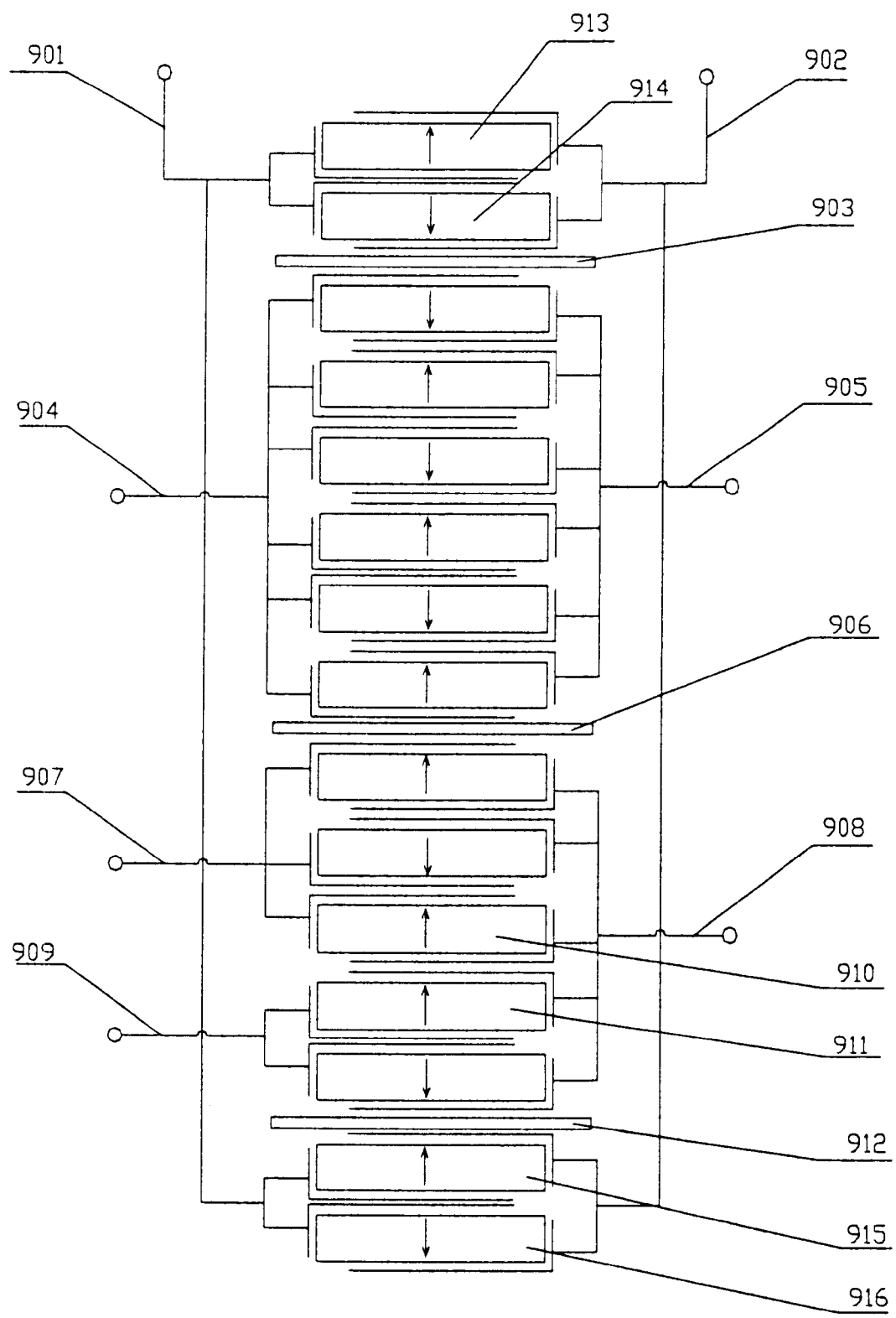
FIG. 9 is the schematic diagram of the structure and the electrical connection of a piezoelectric transformer according to the present invention.

FIG. 9 is the schematic diagram of the construction and the electric connection of a piezoelectric transformer of this embodiment.

The piezoelectric ceramics transformer was designed to operate at an input voltage of 110 V. Each primary piezoelectric ceramics assembly comprises two circular-shaped plates 913 and 914, 915 and 916 respectively, which are made of binary PZT piezoelectric ceramics material with a thickness of 0.6 mm and a diameter of 30 mm. The arrangement of the plates and the side electrodes are shown in FIG. 9. All the side electrodes polarized in the "positive" direction are connected to constitute one of the input electrode 902 of the external input terminals by a terminal plate, whereas those polarized in the "negative" direction are connected in the same way to the other input terminal 901 of the external input terminals.

The secondary piezoelectric ceramics subassembly with an output voltage of 15 V consists of 6 plates which is made of P5 PZT piezoelectric ceramics material, and has a thickness of 0.3 mm and a diameter of 30 mm, the structure of which is similar to that shown in FIG. 1, wherein two side electrodes assemblies constitute the two external output terminal 904 and 905 of 15 V output voltage, respectively.

The secondary piezoelectric subassembly sharing the common grounding electrode and generating output voltages of ±5 V consists of either three or two plates, which are made of P4 piezoelectric ceramics material, 0.12 mm in thickness and 30 mm in diameter, and the three-plates subassembly generates +5 V output voltage, whereas the two-plates subassembly generates −5 V output voltage. The two adjacent piezoelectric ceramics plates 910 and 911 respectively belonging to the two different subassemblies have the same polarization direction. The lead side electrodes which are polarized in a "negative" polarization direction in the +5 output subassembly and the side electrodes which are polarized in a "positive" polarization direction in the −5 V output subassembly are connected with a terminal plate to form the common grounding electrode 908 of the "positive" and "negative" subassembly. Similarly, the lead side electrodes polarized in the "positive" polarization direction in the +5 output subassembly are connected to the +5 V external output terminal 907 by means of a terminal plate, whereas the side electrodes polarized in a "negative" polarization direction in the −5 output subassembly are connected to the −5 V external output terminal 909 by means of a terminal plate. The primary and the secondary piezoelectric ceramics assemblies are separated and isolated by ultra-hard glass plates 903 and 912, which have a thickness of 0.3 mm and a diameter of 32 mm. The secondary subassemblies of 15 V and ±5 V output voltages are also isolated with the isolation plate 906, which has a thickness of 0.2 mm and a diameter of 31 mm.

All these piezoelectric ceramics assemblies and the isolation layers are bonded together with the modified phenolic aldehyde resin adhesive. All cylindrical side surfaces of the secondary piezoelectric ceramics assemblies are coated with epoxy resin to form a sealed construction within coated layer and the isolation plates, so that a complete isolation of the primary and the secondary assemblies can be realized.

The technical parameters of the transformer of this embodiment are as follows:

Operating frequency: 72 kHz

Maximum output power at an output voltage of 15 V: 45 W

Maximum output power at an output voltage of +5 V: 8 W

Maximum output power at an output voltage of −5 V: 5 W

Maximum conversion efficiency: 98%

Size: 32 mm×5.2 mm

I claim:

1. A multi-output composite piezoelectric ceramic transformer with expansion vibration mode, comprising primary and secondary piezoelectric ceramic assemblies, a high polymer bonding structure, an insulating isolative structure and an electrode lead structure;

wherein said primary and secondary piezoelectric ceramic assemblies, as well as the isolation layers of said insulating isolative structure, are laminated one by one and bonded firmly with said polymer bonding structure to form a sandwiched structure, wherein:

the secondary piezoelectric ceramic subassemblies are isolated from each other by an isolation plate and adjacent piezoelectric ceramic plates are polarized in opposite directions to each other in each secondary subassembly, and two adjacent piezoelectric ceramic plates which are at the interface between positive and negative output subassemblies share a common grounding electrode and are arranged in the same polarization directions;

and further including electrodes that are lead out by said electrode lead structure to form external input and output terminals, wherein all lead side electrodes of surface electrodes which are in a positive output piezoelectric ceramic subassembly and the polarization directions thereof are the same as that of an electrode which is in a negative output piezoelectric ceramic subassembly and adjacent to the positive output piezoelectric ceramic subassembly, and are connected by said lead electrode structure;

the lead side electrodes of surface electrodes which are in a negative output piezoelectric ceramic subassembly and the polarization directions thereof are the same as that of a electrode which is in a positive output piezoelectric ceramic subassembly and adjacent to the negative output piezoelectric ceramic subassembly, and are connected to form said common grounding electrode; and all other side electrodes of the positive or the negative output subassemblies are lead out by a lead electrode structure to form the other electrodes of positive or negative outputs;

and wherein exterior surfaces of said secondary piezoelectric ceramic assemblies and electrode lead structure are coated with a film of polymer insulating materials which, together with said isolation layers, form a continuous and integrated insulating isolation structure of the transformer.

2. The multi-output composite piezoelectric ceramic transformer according to claim 1, wherein:

said piezoelectric ceramic transformer comprises a sandwich structure formed by said primary and secondary assemblies as well as isolation layers of said insulating isolative structure, said primary piezoelectric ceramic assembly is divided into two identical assemblies, each assembly of which is located on the top and bottom surfaces of said transformer, respectively, with said secondary piezoelectric ceramic assembly being located in the middle of said transformer, and the isolation layer of said insulating isolative structure is located at each interface of primary and secondary assemblies as well as each interface of different secondary piezoelectric ceramic subassemblies.

3. The multi-output composite piezoelectric ceramic transformer according to claim 1, wherein:

the exterior of said secondary piezoelectric ceramic assembly is completely enclosed by said isolation layers and insulating films to form a reliable isolation between said primary and secondary assemblies, said isolation layers are made of a ceramic, a glass, a polymer film or a film of composite materials which has low dielectric constant, high insulating resistance and high intensity of breakdown electrical field, the shape of said isolation layers is the same as that of said primary ceramic assembly and the diameter is slightly bigger than that of the piezoelectric ceramic assembly while the thickness satisfies the insulating property, the modulus of elasticity being in a range of one tenth to ten times that of the piezoelectric ceramic material in the assemblies, and said insulating film is made of epoxy resin, phenolic aldehyde resin and polyimide resin and covers the outside exposed surface of the secondary piezoelectric ceramic assembly, and is tightly bonded with the isolation plates to form a compact sealed structure.

4. The multi-output composite piezoelectric ceramic transformer according to claim 1, wherein said piezoelectric ceramic transformer comprises an independent electrode lead structure, comprising lead side electrodes of piezoelectric ceramic plates and terminal plates, and wherein one end of each terminal plate is connected to lead side electrodes of a corresponding piezoelectric ceramic assembly by solder to connect said lead side electrodes and the other end of said terminal plate is connected to the input or output wires to form input or output terminals; and said terminal plate is made of copper or steel, and has the same shape as that of the side electrode or side electrode assemblies which it connects, and an area which is the same or slightly smaller than said side electrodes.

5. The multi-output composite piezoelectric ceramic transformer according to claim 1, wherein said primary and secondary piezoelectric ceramic assemblies comprise a series of thin circular-shaped plates with the same diameter, metal electrodes which are formed on the upper and lower surfaces of each plate, and two lead side electrodes on the side surfaces of the plate which are connected to the upper and lower surface electrodes, respectively, to form a portion of said lead electrode structure, and wherein the plates in the primary or the secondary piezoelectric ceramic assemblies are adhered to one another by epoxy adhesive layers to form a laminated construction by the epoxy adhesive layers.

6. The multi-output composite piezoelectric ceramic transformer according to claim 5, wherein the separation between the upper or lower surface electrodes and the lead side electrode on the same plate is larger than 0.3 mm so as to ensure good electric isolation between the two electrodes with opposite polarization directions.

* * * * *